United States Patent [19]
Prochazka et al.

[11] 3,952,260
[45] Apr. 20, 1976

[54] DISTORTION CORRECTION CIRCUIT

[75] Inventors: Antonin Prochazka, Malton; Paul W. Lancaster, Thornhill, both of Canada

[73] Assignee: Delta-Benco-Cascade Limited, Rexdale, Canada

[22] Filed: Dec. 16, 1974

[21] Appl. No.: 533,156

[52] U.S. Cl............................. 330/149; 328/162; 330/24
[51] Int. Cl.²........................................ H03F 1/26
[58] Field of Search ............ 330/24, 149; 328/162; 325/46, 65, 472; 332/18

[56] References Cited
UNITED STATES PATENTS

| | | | |
|---|---|---|---|
| 2,851,614 | 9/1958 | Emanuelsson | 328/162 X |
| 2,999,986 | 9/1961 | Holbrook | 330/149 |
| 3,614,644 | 12/1971 | Lieberman | 330/149 X |

*Primary Examiner*—James B. Mullins

[57] ABSTRACT

There is provided a circuit which may be connected across the signal path on either the input or the output of an amplifier and which is designed to distort the signal in a manner which is complementary to the distortion contributed by the amplifier so that the resultant signal is to a large degree undistorted. The circuit utilizes a diode connected across the signal path of an amplifier with means for preventing the flow through the diode of direct current voltages appearing across the signal path. Means are provided for forward biasing the diode. The diode is selected to be of the type to have characteristics suitable for operation above 50 MHz. The diode is also selected, along with the degree of forward bias and reactive elements to provide the required compensation.

28 Claims, 6 Drawing Figures

DISTORTION CORRECTION CIRCUIT

This invention relates to a circuit for removing certain distortions in a signal amplified by an amplifier, caused by the non-linear operation of the amplifier.

By a 'non linear device' herein we mean a device having a non linear voltage dependent resistance.

The amplifiers with which the invention is concerned are those used in wide band communications systems carrying a plurality of carriers, modulated and unmodulated. Although the scope of the invention is not operably limited to the following frequency range, its principal advantage over prior systems, is with carrier frequencies over 50 Megahertz.

At such frequencies of over 50 Megahertz the amplification will be performed by semi-conductor elements such as junction transistors, diodes and field effect transistors. The devices referred to above will hereinafter be referred to as non-linear semi-conductor elements.

Carrier frequencies of over 50 Megahertz will commonly be in the VHF range 50–300 MHz and in the UHF range 470–900 MHz. Again, without limiting the invention, a very common, and useful application thereof will be with amplifiers used in cable television transmission systems where the signals of a number of channels are transmitted over the same path.

The amplifier distortions for which the circuitry is designed to correct are cross-modulation and triple beat distortion. Although other types of distortion exist in high frequency wide band communication, than those above mentioned these other types will, it is believed, be better corrected by other methods.

Cross modulation distortion relates to variation in the amplitude of one carrier due to the amplitude modulation existing on another carrier travelling on the same electrical path. In the frequency range with which the amplitude is principally concerned, i.e. over 50 MHZ, it is found that cross-modulation distortion involves not only distortion of the amplitude but also of the phase of the affected signal.

Triple beat distortion arises from the fact that a beat product can be formed from those results of the algebraic summing of the values of the frequencies of three carriers travelling on a common path (each having different frequencies) where two of the frequencies have like sign and one frequency is of opposite sign. At the frequencies where applicant's invention has its principal advantage (i.e. over 50 MHz) the phase effects on signals due to this type of distortion are substantive as are the amplitude effects.

The inventive circuit may also be used to correct other types of third order distortion products than those listed above, such other types including: third harmonic and third order intermodulation distortion products, and other types of triple best distortion.

Prior methods of compensating for cross-modulation and triple beat distortion have included circuits for pre-distortion the signal being supplied to an amplifier to complement the distortion occurring at the amplifier. Such prior devices have suffered from the disadvantages that while they corrected for amplitude distortion which occurred in frequencies less than 1 MHz they were not designed to operate properly at frequencies over 50 MHz or to correct the phase of distortions which occur above those frequencies.

In drawings which illustrate a preferred embodiment of the invention:

This invention provides a circuit which may be connected across the signal path on either the input or the output side of an amplifier and which is designed to distort the signal in a manner which is complementary to the distortion contributed by the amplifier so that the resultant signal is to a large degree undistorted.

By 'signal path' is meant that pair of leads or wires at any part of those amplifier circuits with which the invention is concerned between which the RF signal voltage appears, and is conducted in its travel (in various magnitudes and forms and amplified or distorted) between the source of such signals and the destination. At any point in the signal path one of the leads or wires will almost always be (but need not necessarily be) ground.

The inventive circuit is designed to provide greatest advantages over prior circuits at frequencies greater than 50 MHz and to compensate, at such frequencies, not only for amplitude of distortion but also for phase of distortion.

The circuit comprises a diode connected in a connection across the signal path of an amplifier. Means are provided in said connection, in series with said diode, for preventing the flow through said diode of direct currents due to direct current voltages existing across said path. Means are provided for forward biasing the diode. Reactive elements are provided in series with the diode or in parallel therewith or both. Usually a resistance is required in series with the diode. The diode is selected to be of the type to have characteristics suitable for operation above 50 MHz. The diode is also selected, along with the degree of forward bias, so that the circuit provides a beat with magnitude the same but the phase opposite to that generated in the amplifier circuit with which it is associated.

Figure 5:
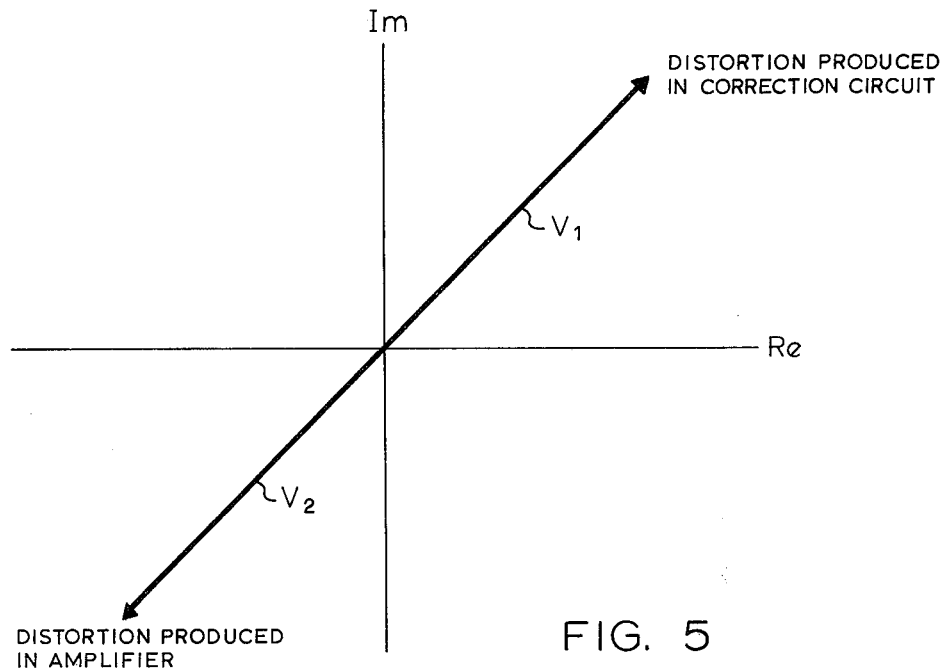
FIGS. 5 and 6 are graphs explaining the vector representation of distortions and corrections.
Figure 6:
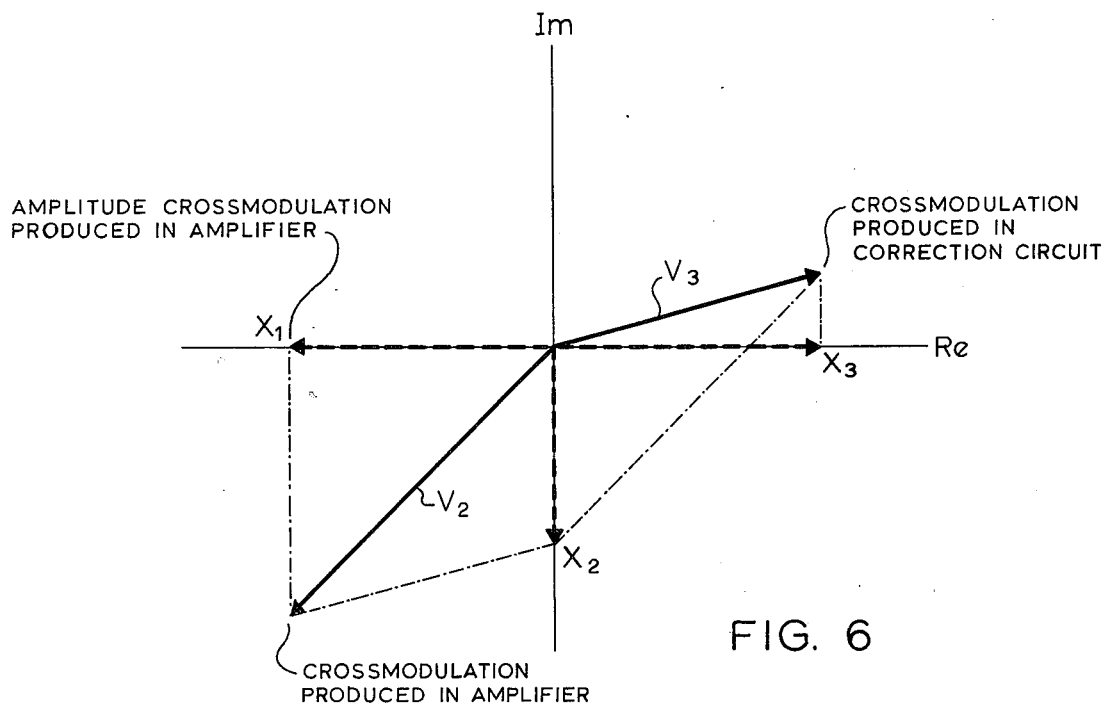

FIG. 5 shows the vector, V1 representing the effects of the inventive correction circuit equal and opposite to the vector V2 representing the distortion produced in the amplifier. The real and imaginary axes in FIGS. 5 and 6 are chosen by treating the input signal to the amplifier-compensating circuit or compensating circuit-amplifier tandem as having a vector along the real axis. As shown in FIG. 6, in correcting for amplitude cross-modulation, the vector V3 representing the cross modulation produced in the correction circuit need not be precisely opposite in phase to V2 (distortion produced in the amplifier) so long as the corrective circuit is designed to provide a vector V3 which has a real component X3 which is substantially equal in magnitude to and opposite in sign to the real component X, of the cross-modulation produced in the amplifier. Placing the diode circuit on the signal path at the input instead of the output of the circuit will result in a difference in scale of the effects, produced by the diode circuit but the principle is of course the same. Depending on its bias the diode will have, primarily, a resistance or a capacitive characteristic. It has been found preferable to operate the diode at high biases where the reactance due to junction capacitance of the diode tends to be much higher than the junction resistance of the diode. The result is that the diode effectively appears to the alternating current signal as a resistance. In this mode of operation the reactive component which determines the phase of the distortion required of the diode circuit to correct for phase of amplifier distortion is provided by discrete parallel or series reactances. Usually the resistance of the diode requires a resistance in series therewith to properly load the signal circuit and to properly apportion the alternating current signal voltage between that appearing across the diode and that appearing across the resistance.

It should be noted that it is within the scope of the invention to provide an inventive circuit providing part of the compensating effect on the input side of the amplifier and an inventive circuit providing part of the compensating effect on the output side of the amplifier. Further where it is desired to use the inventive circuit it may sometimes be desireable to use two or more of these in cascade. This would be done where a single circuit could not compensate for the various types of third order distortion products. Thus it will usually be practical to design the inventive circuit as above described to compensate for both amplitude cross-modulation and for triple beat distortion. However if it is desired to compensate, at the same circuit locations, for such effects as third harmonic distortion and third order intermodulation distortion products this may require a second or third inventive circuit in cascade. In such cases and by adjustment each circuit will be designed to compensate for the amplifier circuit and the other inventive circuits.

The diodes which have been found most suitable for the 50–900 MHz range and for the biases required are the Schottky barrier diode, the point contact diode and the junction diode.

Figure 1:
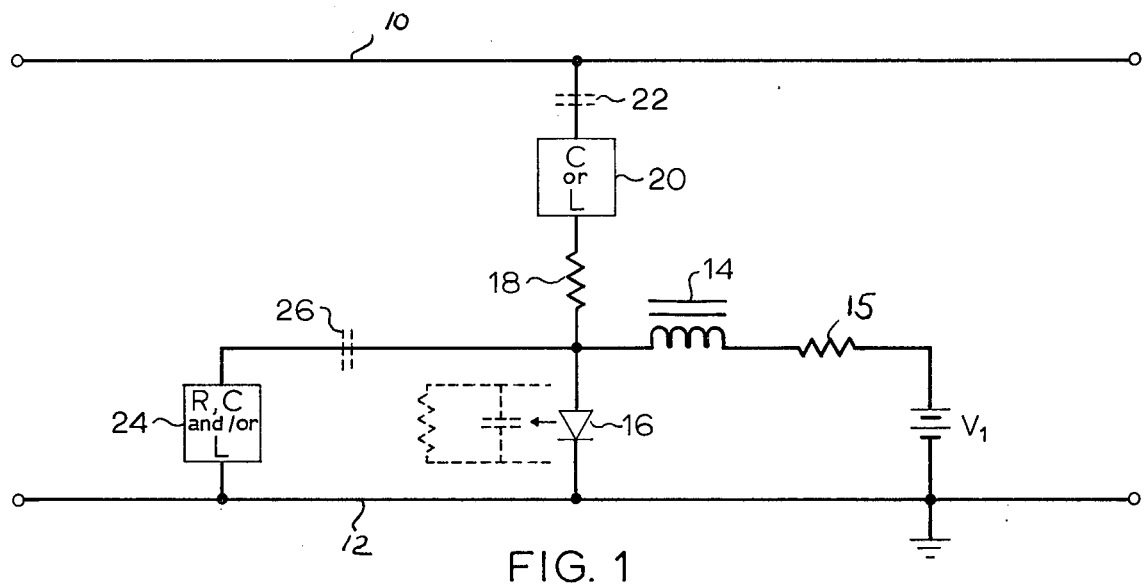
FIG. 1 shows the preferred embodiment of the invention.

As seen in FIG. 1 the circuit comprises a pair of lines 10 and 12 which represent the signal path and which may be either at the input or the output of an amplifier.

The line 12 is here, for example, shown as ground. A diode 16 is connected in series with direct current voltage V1, a resistor 15 and a choke coil 14. The small signal equivalent circuit of the diode 16 comprising a resistance and capacitance in parallel is shown in dotted form beside the diode. The voltage $V_1$ is chosen relative to line 12 to forward bias the diode and the high resistance 15 along with the voltage $V_1$ is selected to provide the forward bias current desired. The terminal of diode 16 which is connected to choke coil 14 is also connected to line 10 through a resistance 18. A reactance 20 may optionally be included in series with resistance 18 as hereafter discussed. Also in series with resistance 18 may be a capacitance 22. A capacitance is required between line 10 and diode 16 to prevent the direct current component of the voltage across lines 10 and 12 from flowing through diode 16. Thus, if the reactance 20 does not include a capacitance which breaks the direct current path between line 10 and the diode, the capacitance 22 must be included.

As hereafter discussed, in parallel with diode 16, is an impedance 24. Optionally included is condenser 26 which may be required to prevent a direct current connection in parallel with diode 16. Thus if impedance 24 does not include a condensor to break the direct current path which would otherwise exist in parallel with diode 16, the condenser 26 will be included in series with impedance 24 for this purpose.

Figure 2:
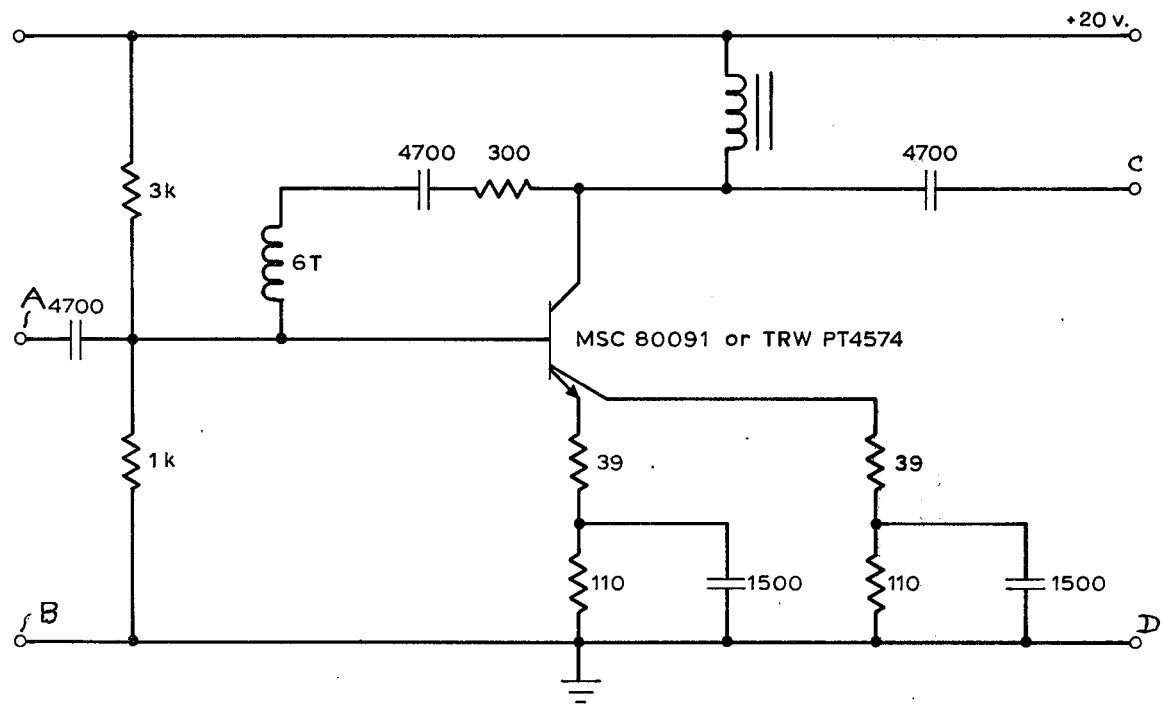
FIG. 2 shows one of a number of amplifier circuits with which the invention may be used.

FIG. 2 shows a typical transistor amplifier circuit with which the invention may be used. Many other transistor amplifier circuits well known to those skilled in the art may also be combined with the inventive circuit. As in other amplifier circuits the circuit shown is shunting (i.e. connected across) the input signal path i.e. across terminals A–B designed to provide the signal to be amplified across the base-emitter terminals of the transistor. Also, as in other amplifiers, the amplified signal from the amplifier appears across terminals C–D. Thus the inventive circuit may be connected across terminals A–B or C–D. The parameters of the circuit will be different in each case to take into account the difference in magnitude of the unamplified and amplified signal and the inversion of the cascaded amplifier and corrective distortion circuit.

In relation to the terms amplifier and amplifier circuit herein it should be noted that these terms not only include the amplifying transistor (or equivalent device) itself but also the necessary incidental circuitry of biasing and power equipment. Thus although the distortion to be corrected by the inventive circuit is primarily due to the amplifying device itself the distortion produced by the circuit will have characteristics contributed by the amplifier circuit parameters. The terms amplifier and amplifier circuit are also used herein to include circuits having two or more such amplifiers or amplifiers in cascade. In such case the inventive circuit will be used to compensate for the 'cascaded' or cumulative distortion contributed by the two amplifiers.

The amplifying circuits for which the invention provides compensation will most commonly use a conventional transistor as the amplifying element. However the inventive circuit may also be used with circuits using such amplifying elements as field effect transistors and certain diodes.

Measurements and calculations in accord with methods well known to those skilled in the art are made of the amplifier circuit with which the invention is used, to determine the extent of cross-modulation and triple beat distortion. These measurements determine the required amplitude and phase corrections.

The magnitude of the correction is determined by the ratio of the resistance 18 to the RF resistance of the diode 16. The phase of the correction is determined by the reactance components of block 20 and/or block 24 and the included capacitance of diode 16.

It is found preferable, to render negligible the effects of the capacitive reactance of the diode, by operating the diode at a relatively high bias current (i.e. between 0.1 and 5.0 milliamps). At such bias currents the RF resistance of the diode is sufficiently lower than the capacitive reactance that the diode 16 may be considered as a pure resistance. The exact level of the bias will of course be selected to achieve the magnitude of the amplitude distortion correction required. The level of the bias determines the RF resistance of the diode and this RF resistance in the alternating current circuit between lines 10 and 12 is caused to determine the magnitude of the distortion correction which magnitude is, of course, also affected by the selection of resistance 18. The relative values of the RF resistance of the diode and of the resistance 18 are selected to determine the magnitude of the distortion correction. The actual values of these resistances should be chosen so that the signal path is not unduly loaded. Although values will vary, when the circuits are used in cable T.V. applications, the source and load impedances "seen" by the circuit will be 75 Ω (substantially purely resistive). In such cable T.V. applications the resistance 18 is preferably of the order of 1000 Ω.

The required phase for distortion correction may be achieved by the design and selection of the series reactance 20, the parallel impedance 24 taking into account the reactance (mainly capacitive) of the diode 16 and of any isolating capacitance. Either reactance 20 or the reactive component of impedance 24 may be capacitive or inductive or a combination thereof and it may be desirable to include a resistive component in the impedance 24.

Where no reactance or resistance is required at impedance 24 in the portion of the circuit shunting the diode 16 this portion may of course be omitted.

Where the diode is biased to render its impedance substantially resistive the phase correction is performed in the members 20 and/or 24.

The diodes suitable for the purposes and the circuitry of this invention are the Schottky barrier diode, the point contact diode and the junction diode. Also useful as diodes within the scope of the invention is a transistor using only its emitter and base terminals and in some cases a transistor using only its base and collector terminals.

Figure 3:
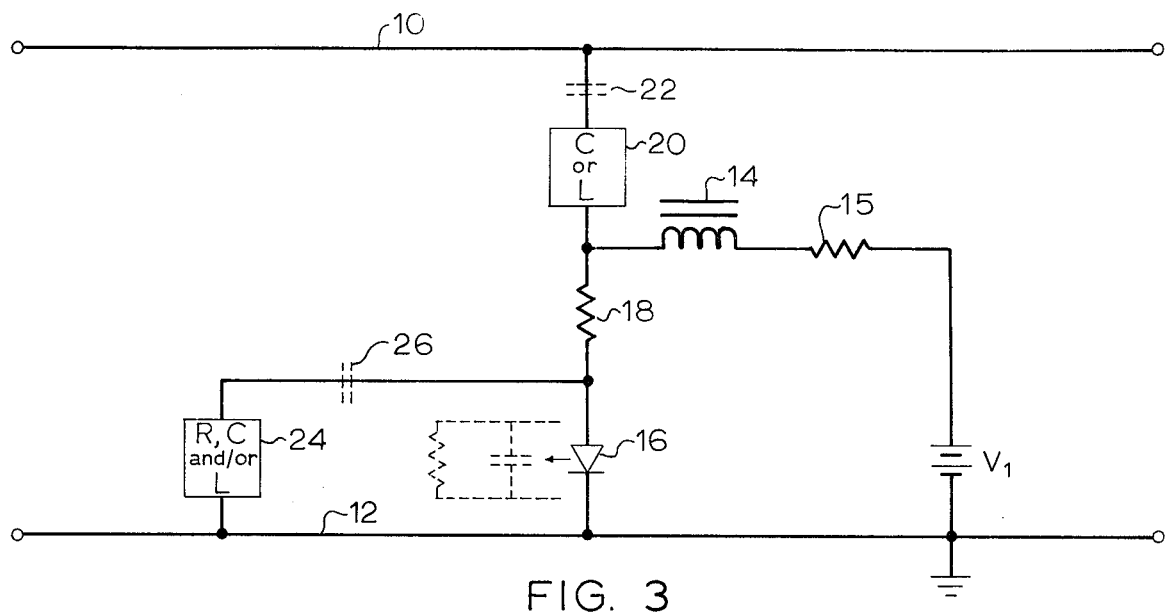
FIG. 3 shows an alternative to the circuit of FIG. 1.

The invention applies to those alternatives to the specific embodiment which are found within definition of the appended claims. However two common alternatives would include:

1. Connecting as shown in FIG. 3 the biasing circuit comprising the voltage V1, resistance 15 and choke coil 14 between block 20 and resistance 18 instead of connecting this circuit below the resistor 18. This creates no change in the RF or AC circuit between lines 10 and 12 but includes the resistance 18 in the biasing circuit in series with the resistance 15 and the voltage Vi. Thus the resistance 15 will be modified to take into account the presence of the resistance 18 but since the resistance 15 will usually be considerably larger than resistance 18 the modification will be small.

Preferred values for the circuit of FIG. 1 are
15–20 K Ω
18–1000 Ω
V–20 V

In theory it would be possible to operate the circuit of FIG. 3 without the resistance 15.

The only resistance in the biasing circuit would then be resistance 18 and voltage Vi would have to be much smaller (of the order of 1/20 the value of Vi with the resistance 15 included in series therewith) to produce the same bias current. However without resistance 15 the risk is very large of damage to the diode through small variation in the power supply voltage Vi.

Figure 4:
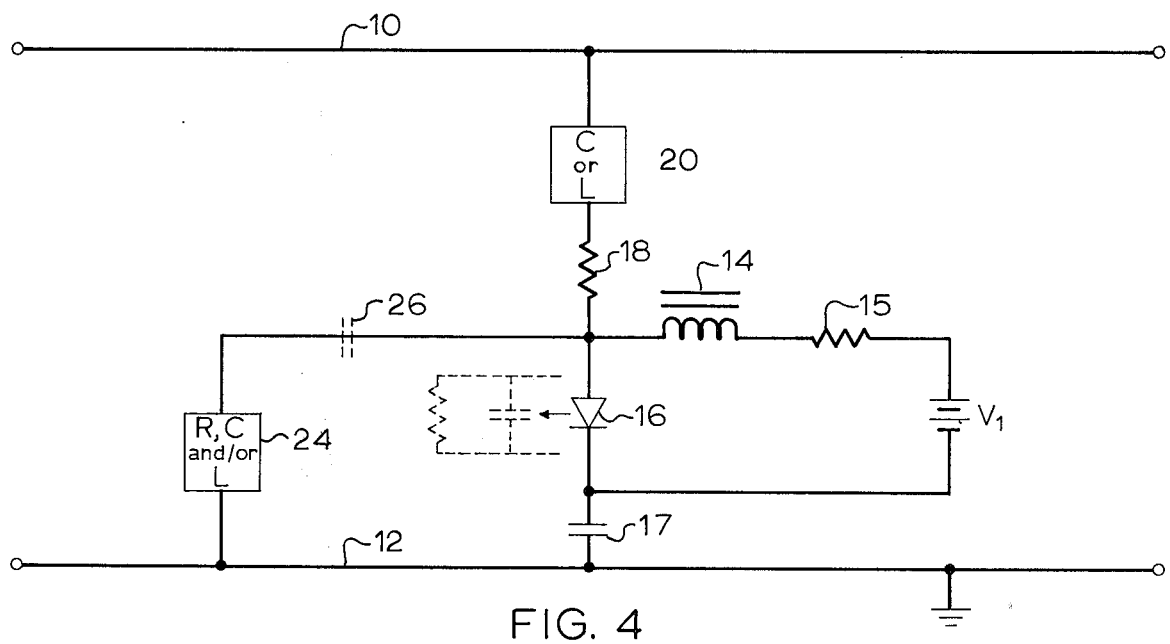
FIG. 4 shows another alternative to the circuit of FIG. 1.

2. A second alternative, shown in FIG. 4 provides for the connection of the biasing series circuit having Vi, resistance 15 and choke coil 14 in series across the diode 16 but isolated from line 12 by condenser 17. Condenser 17 is of course of a value to easily pass the radio frequency (RF) signal. With the condenser 17 it will be unnecessary to include the condensor 26. It will be noted that, with proper adjustment of the resistance 15 values, the end of the biasing circuit connected between resistance 18 and diode 16 may instead be connected between reactance 20 and resistance 18.

I claim:

1. Distortion compensating circuit for use with nonlinear amplifying device comprising:
   a diode having one terminal connected to one of the conductors forming the input path of a transistor amplifier,
   a direct current potential and resistance in series therewith connected to the other terminal of said diode to forward bias said diode relative to the conductor to which it is connected.
   a connection from said other terminal of said diode to the other conductor of said input path,
   means for preventing direct current flow while allowing alternating current flow in said last-mentioned connection,
   reactive impedance means connected in said circuit to determine the phase of alternating current signals appearing across said diode.

2. A circuit as claimed in claim 1 wherein the diode is a Schottky barrier diode.

3. A circuit as claimed in claim 2 wherein said potential is selected to provide a bias current of from 0.1 to 5.0 milliamps in said diode.

4. A circuit as claimed in claim 1 wherein the diode is a point contact diode.

5. A circuit as claimed in claim 4 wherein said potential is selected to provide a bias current of from 0.1 to 5.0 milliamps in said diode.

6. A circuit as claimed in claim 1 wherein the diode is a junction diode.

7. A circuit as claimed in claim 6 wherein said potential is selected to provide a bias current of from 0.1 to 5.0 milliamps in said diode.

8. Distortion compensating circuit for use with nonlinear amplifier comprising:
   a diode having one terminal connected to one of the conductors forming the output path of a transistor amplifier,
   a direct current potential and resistance in series therewith connected to the other terminal of said diode to forward bias said diode relative to the conductor to which it is connected,
   a connection from said other terminal of said diode to the other conductor of said output path,
   means for preventing direct current flow while allowing alternating current flow in said last-mentioned connection,
   relative impedance means connected in said circuit to determine the phase of alternating current signals appearing across said diode.

9. A circuit as claimed in claim 8 wherein the diode is a Schottky barrier diode.

10. A circuit as claimed in claim 9 wherein said potential is selected to provide a bias current of from 0.1 to 5.0 milliamps in said diode.

11. A circuit as claimed in claim 8 wherein the diode is a point contact diode.

12. A circuit as claimed in claim 11 wherein said potential is selected to provide a bias current of from 0.1 to 5.0 milliamps in said diode.

13. A circuit as claimed in claim 8 wherein the diode is a junction diode.

14. A circuit as claimed in claim 13 wherein said potential is selected to provide a bias current of from 0.1 to 5.0 milliamps in said diode.

15. Distortion compensating circuit for use with nonlinear amplifying device comprising:
   a diode connected in a connection across the input signal path of an amplifier, means in said connection, in series with said diode, preventing the flow through said diode of direct currents due to direct current voltages across the path connected by said connection, means for forwardly biasing said diode comprising:

a source of direct current potential and resistance in series therewith connected to one terminal of said diode between said diode and said direct current flow preventing means, of a polarity and magnitude to forward bias said diode, reactive impedance elements forming part of said connection, arranged to affect the phase of the signal across said circuit.

16. A circuit as claimed in claim 15 wherein the diode is a Schottky barrier diode.

17. A circuit as claimed in claim 15 wherein the diode is a point contact diode.

18. A circuit as claimed in claim 15 wherein the diode is a junction diode.

19. Distortion compensating circuit for non-linear amplifier comprising:

a diode connected across the input signal path of an amplifier, means in series with said diode isolating said diode from direct current voltage at one of said signal terminals, said means being designed to allow passage of alternating current signals, means for forwardly biasing said diode comprising:

a potential connected to one side of said diode between said diode and said isolating means selected to be in such relationship to the direct current potential on the side of said diode remote from said isolating means, as to forward bias said diode, reactive impedance elements connected to affect the phase of the signal across said circuit.

20. A circuit as claimed in claim 19 wherein the diode is a Schottky barrier diode.

21. A circuit as claimed in claim 19 wherein the diode is a point contact diode.

22. A circuit as claimed in claim 19 wherein the diode is a junction diode.

23. Distortion compensating circuit comprising:

a diode, a direct current circuit for forward biasing said diode including:

a potential source and resistance in series with said diode, said potential source being poled to forward bias said diode, an alternating current circuit including said diode and a resistance in series therewith, said alternating current circuit being designed to have one end thereof connected to one conductor of a signal path and the other end thereof connected to the other conductor of a signal path, a condensor in said alternating current circuit located to prevent direct current flow between the conductors of said signal path while located to allow direct current flow in said direct current circuit and reactive impedance means connected in said alternating current circuit to determine the phase of alternating current signals in said circuit.

24. A circuit as claimed in claim 23 wherein the diode is a Schottky barrier diode.

25. A circuit as claimed in claim 23 wherein the diode is a point contact diode.

26. A circuit as claimed in claim 23 wherein the diode is a junction diode.

27. Distortion compensating circuit for use with non-linear amplifying device comprising:

a diode connected in a connection across the output signal path of an amplifier, means is said connection, in series with said diode, preventing the flow through said diode of direct currents due to direct current voltages across the path connected by said connection, means for forwardly biasing said diode comprising:

a source of direct current potential and resistance in series therewith connected to one terminal of said diode between said diode and said direct current flow preventing means, of a polarity and magnitude to forward bias said diode, reactive impedance elements forming part of said connection, arranged to affect the phase of the signal across said circuit.

28. Distortion compensating circuit for non-linear amplifier comprising:

a diode connected across the output signal path of an amplifier, means in series with said diode isolating said diode from direct current voltage at one of said signal terminals, said means being designed to allow passage of alternating current signals, means for forwardly biasing said diode comprising:

a potential connected to one side of said diode between said diode and said isolating means selected to be in such relationship to the direct current potential on the side of said diode remote from said isolating means, as to forward bias said diode, reactive impedance elements connected to affect the phase of the signal across said circuit.

* * * * *